(12) United States Patent
Pettis et al.

(10) Patent No.: US 9,169,968 B2
(45) Date of Patent: Oct. 27, 2015

(54) COLOR THREE DIMENSIONAL PRINTING

(71) Applicant: MakerBot Industries, LLC, Brooklyn, NY (US)

(72) Inventors: Nathaniel B. Pettis, Brooklyn, NY (US); Robert J. Steiner, Port Jefferson, NY (US); Peter Joseph Schmehl, New York, NY (US); Charles E. Pax, Manchester, NH (US)

(73) Assignee: MakerBot Industries, LLC, Brooklyn, NY (US)

( * ) Notice: Subject to any disclaimer, the term of this patent is extended or adjusted under 35 U.S.C. 154(b) by 243 days.

(21) Appl. No.: 13/914,072

(22) Filed: Jun. 10, 2013

(65) Prior Publication Data

US 2013/0328228 A1 Dec. 12, 2013

Related U.S. Application Data

(60) Provisional application No. 61/657,241, filed on Jun. 8, 2012.

(51) Int. Cl.
| | |
|---|---|
| *B28B 1/14* | (2006.01) |
| *F16M 13/02* | (2006.01) |
| *B29C 67/00* | (2006.01) |
| *G06F 17/50* | (2006.01) |
| *G06F 3/12* | (2006.01) |
| *F16M 11/12* | (2006.01) |
| *F16M 11/18* | (2006.01) |

(52) U.S. Cl.
CPC .......... *F16M 13/022* (2013.01); *B29C 67/0059* (2013.01); *B29C 67/0081* (2013.01); *B29C 67/0085* (2013.01); *F16M 11/12* (2013.01); *F16M 11/18* (2013.01); *G06F 3/126* (2013.01); *G06F 3/1224* (2013.01); *G06F 17/50* (2013.01); *Y02T 10/82* (2013.01)

(58) Field of Classification Search
CPC ..................... B29C 67/005; B29K 2995/0073
USPC ................... 264/129, 176.1, 40.1, 40.7, 308; 425/145, 150, 375, 112, 113; 700/118, 700/119, 120; 226/8, 24, 26, 42, 43, 45
See application file for complete search history.

(56) References Cited

U.S. PATENT DOCUMENTS

| | | | | |
|---|---|---|---|---|
| 5,121,329 | A * | 6/1992 | Crump | ........................ 425/174.4 |
| 6,129,872 | A | 10/2000 | Jang | |
| 6,165,406 | A * | 12/2000 | Jang et al. | ...................... 425/375 |
| 8,414,280 | B2 * | 4/2013 | Pettis | ............................ 425/150 |
| 2014/0079841 | A1 | 3/2014 | Pridoehl et al. | |
| 2014/0088751 | A1 | 3/2014 | Pridoehl et al. | |

OTHER PUBLICATIONS

, "3D FUNPOD", http://phlatboyz.blogspot.com/2012/02/3d-printed-micro-3d-3d-funpod-3d-funpod.html, Feb. 8, 2012 , pp. 1-3.
, "Ultra-Bot 3D Printer, William Steele", http://www.kickstarter.com/projects/wjsteele/ultra-bot-3d-printer/posts/362119, Dec. 4, 2012 , pp. 1-17.

* cited by examiner

*Primary Examiner* — Joseph S Del Sole
*Assistant Examiner* — Thukhanh T Nguyen
(74) *Attorney, Agent, or Firm* — Strategic Patents, P.C.

(57) ABSTRACT

A variety of techniques for color mixing support a user-controllable palette of colors for use when fabricating three-dimensional objects.

23 Claims, 13 Drawing Sheets

US 9,169,968 B2

COLOR THREE DIMENSIONAL PRINTING

RELATED APPLICATIONS

This application claims the benefit of U.S. App. No. 61/657,241 filed on Jun. 8, 2012, the entire content of which is hereby incorporated by reference.

BACKGROUND

Three dimensional printers can create physical models from digital designs. While current printers can use a variety of different colors of build materials for greater flexibility in realizing aesthetic or functional objects, attempts to mix different colors have generally provided unsatisfactory results in extrusion-based processes due in large part to the highly viscous nature of thermoplastics and other typical build materials. There remains a need for color mixing in three dimensional printing to provide greater user control over the look of fabricated items.

SUMMARY

A variety of techniques for color mixing support a user-controllable palette of colors when fabricating three-dimensional objects.

BRIEF DESCRIPTION OF THE FIGURES

The invention and the following detailed description of certain embodiments thereof may be understood by reference to the following figures.

DETAILED DESCRIPTION

All documents mentioned herein are hereby incorporated in their entirety by reference. References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context. Thus the term "or" should generally be understood to mean "and/or" and so forth.

The following description emphasizes three-dimensional printers using fused deposition modeling or similar techniques where a bead of material is extruded in a layered series of two dimensional patterns as "roads," "paths" or the like to form a three-dimensional object from a digital model. It will be understood, however, that numerous additive fabrication techniques are known in the art including without limitation multijet printing, stereolithography, Digital. Light Processor ("DLP") three-dimensional printing, selective laser sintering, and so forth. Such techniques may benefit from the systems and methods described below, and all such printing technologies are intended to fall within the scope of this disclosure, and within the scope of terms such as "printer", "three-dimensional printer", "fabrication system", and so forth, unless a more specific meaning is explicitly provided or otherwise clear from the context.

Figure 1:
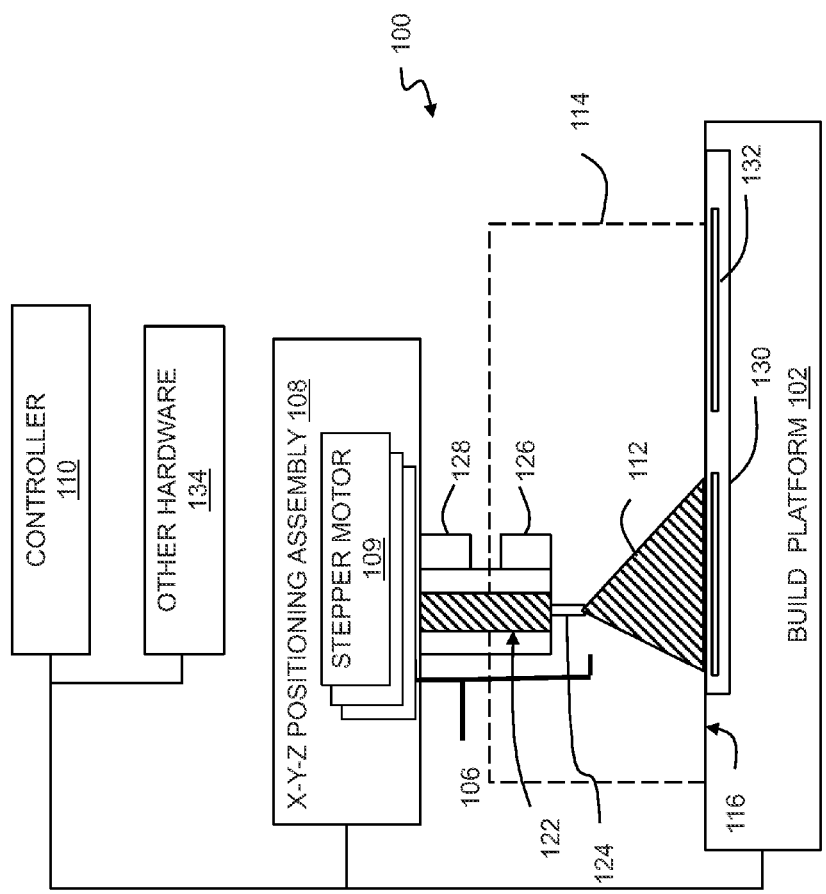
FIG. 1 is a block diagram of a three-dimensional printer.

FIG. 1 is a block diagram of a three-dimensional printer. In general, the printer 100 may include a build platform 102, an extruder 106, an x-y-z positioning assembly 108, and a controller 110 that cooperate to fabricate an object 112 within a working volume 114 of the printer 100.

The build platform 102 may include a surface 116 that is rigid and substantially planar. The surface 116 may provide a fixed, dimensionally and positionally stable platform on which to build the object 112. The build platform 102 may include a thermal element 130 that controls the temperature of the build platform 102 through one or more active devices 132, such as resistive elements that convert electrical current into heat, Peltier effect devices that can create a heating or cooling effect, or any other thermoelectric heating and/or cooling devices. The thermal element 130 may be coupled in a communicating relationship with the controller 110 in order for the controller 110 to controllably impart heat to or remove heat from the surface 116 of the build platform 102.

The extruder 106 may include a cavity 122 in an interior thereof to receive a build material. The build material may, for example, include acrylonitrile butadiene styrene ("ABS"), high-density polyethylene ("HDPL"), polylactic acid ("PLA"), or any other suitable plastic, thermoplastic, or other material that can usefully be extruded to form a three-dimensional object. The extruder 106 may include an extrusion tip 124 or other opening that includes an exit port with a circular, oval, slotted or other cross-sectional profile that extrudes build material in a desired cross-sectional shape.

The extruder 106 may include a heater 126 (also referred to as a heating element) to melt thermoplastic or other meltable build materials within the cavity 122 for extrusion through an extrusion tip 124 in liquid form. While illustrated in block form, it will be understood that the heater 126 may include, e.g., coils of resistive wire wrapped about the extruder 106, one or more heating blocks with resistive elements to heat the extruder 106 with applied current, an inductive heater, or any other arrangement of heating elements suitable for creating heat within the cavity 122 sufficient to melt the build material for extrusion. The extruder 106 may also or instead include a motor 128 or the like to push the build material into the cavity 122 and/or through the extrusion tip 124.

In general operation (and by way of example rather than limitation), a build material such as ABS plastic in filament form may be fed into the cavity 122 from a spool or the like by the motor 128 (which may include two or more filament drive motors, e.g., where multiple filaments are used concurrently), melted by the heater 126, and extruded from the extrusion tip 124. By controlling a rate of the motor 128, the temperature of the heater 126, and/or other process parameters, the build material may be extruded at a controlled volumetric rate. It will be understood that a variety of techniques may also or instead be employed to deliver build material at a controlled volumetric rate, which may depend upon the type of build material, the volumetric rate desired, and any other factors. All such techniques that might be suitably adapted to delivery of build material for fabrication of a three-dimensional object are intended to fall within the scope of this disclosure.

The x-y-z positioning assembly 108 may generally be adapted to three-dimensionally position the extruder 106 and the extrusion tip 124 within the working volume 114. Thus by controlling the volumetric rate of delivery for the build material and the x, y, z position of the extrusion tip 124, the object 112 may be fabricated in three dimensions by depositing successive layers of material in two-dimensional patterns derived, for example, from cross-sections of a computer model or other computerized representation of the object 112. A variety of arrangements and techniques are known in the art to achieve controlled linear movement along one or more axes. The x-y-z positioning assembly 108 may, for example, include a number of stepper motors 109 to independently control a position of the extruder 106 within the working volume along each of an x-axis, a y-axis, and a z-axis. More generally, the x-y-z positioning assembly 108 may include without limitation various combinations of stepper motors, encoded DC motors, gears, belts, pulleys, worm gears, threads, and so forth. For example, in one aspect the build platform 102 may be coupled to one or more threaded rods by a threaded nut so that the threaded rods can be rotated to provide z-axis positioning of the build platform 102 relative to the extruder 106. This arrangement may advantageously simplify design and improve accuracy by permitting an x-y positioning mechanism for the extruder 106 to be fixed relative to a build volume. Any such arrangement suitable for controllably positioning the extruder 106 within the working volume 114 may be adapted to use with the printer 100 described herein.

In general, this may include moving the extruder 106, or moving the build platform 102, or some combination of these. Thus it will be appreciated that any reference to moving an extruder relative to a build platform, working volume, or object, is intended to include movement of the extruder or movement of the build platform, or both, unless a more specific meaning is explicitly provided or otherwise clear from the context. Still more generally, while an x, y, z coordinate system serves as a convenient basis for positioning within three dimensions, any other coordinate system or combination of coordinate systems may also or instead be employed, such as a positional controller and assembly that operates according to cylindrical or spherical coordinates.

The controller 110 may be electrically or otherwise coupled in a communicating relationship with the build platform 102, the x-y-z positioning assembly 108, and the other various components of the printer 100. In general, the controller 110 is operable to control the components of the printer 100, such as the build platform 102, the x-y-z positioning assembly 108, and any other components of the printer 100 described herein to fabricate the object 112 from the build material. The controller 110 may include any combination of software and/or processing circuitry suitable for controlling the various components of the printer 100 described herein including without limitation microprocessors, microcontrollers, application-specific integrated circuits, programmable gate arrays, and any other digital and/or analog components, as well as combinations of the foregoing, along with inputs and outputs for transceiving control signals, drive signals, power signals, sensor signals, and so forth. In one aspect, this may include circuitry directly and physically associated with the printer 100 such as an on-board processor. In another aspect, this may be a processor associated with a personal computer or other computing device coupled to the printer 100, e.g., through a wired or wireless connection. Similarly, various functions described herein may be allocated between an on-board processor for the printer 100 and a separate computer. All such computing devices and environments are intended to fall within the meaning of the term "controller" or "processor" as used herein, unless a different meaning is explicitly provided or otherwise clear from the context.

A variety of additional sensors and other components may be usefully incorporated into the printer 100 described above. These other components are generically depicted as other hardware 134 in FIG. 1, for which the positioning and mechanical/electrical interconnections with other elements of the printer 100 will be readily understood and appreciated by one of ordinary skill in the art. The other hardware 134 may include a temperature sensor positioned to sense a temperature of the surface of the build platform 102, the extruder 126, or any other system components. This may, for example, include a thermistor or the like embedded within or attached below the surface of the build platform 102. This may also or instead include an infrared detector or the like directed at the surface 116 of the build platform 102.

In another aspect, the other hardware 134 may include a sensor to detect a presence of the object 112 at a predetermined location. This may include an optical detector arranged in a beam-breaking configuration to sense the presence of the object 112 at a predetermined location. This may also or instead include an imaging device and image processing circuitry to capture an image of the working volume and to analyze the image to evaluate a position of the object 112. This sensor may be used for example to ensure that the object 112 is removed from the build platform 102 prior to beginning a new build on the working surface 116. Thus the sensor may be used to determine whether an object is present that should not be, or to detect when an object is absent. The feedback from this sensor may be used by the controller 110 to issue processing interrupts or otherwise control operation of the printer 100.

The other hardware 134 may also or instead include a heating element (instead of or in addition to the thermal element 130) to heat the working volume such as a radiant heater or forced hot air heater to maintain the object 112 at a fixed, elevated temperature throughout a build, or the other hardware 134 may include a cooling element to cool the working volume.

Figure 2:
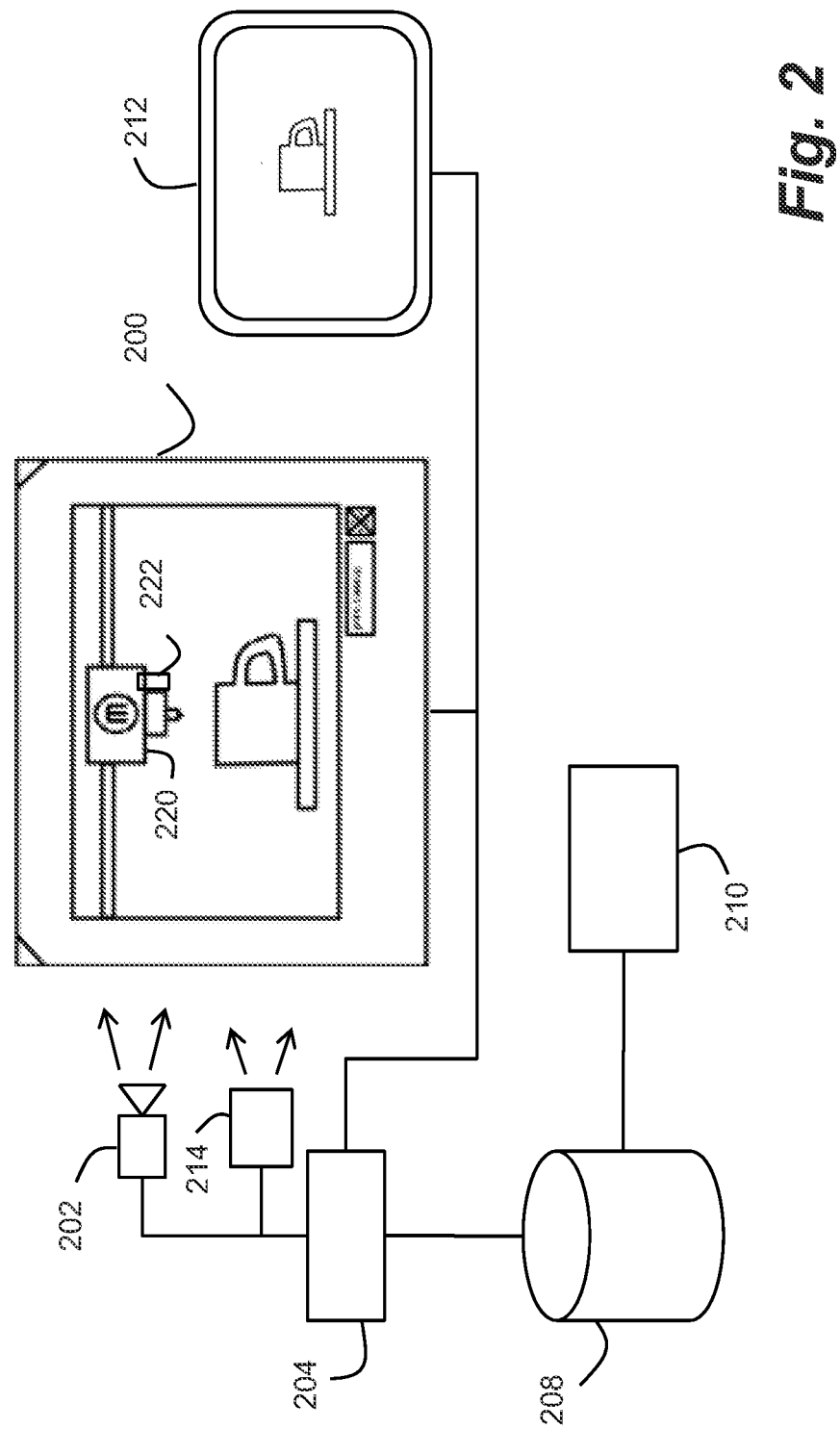
FIG. 2 shows a three-dimensional printer with a camera.

FIG. 2 shows a three-dimensional printer. The printer 200 may include a camera 202 and a processor 204. The printer 200 may be configured for augmented operation using two-dimensional data acquired from the camera 202.

The printer 200 may, for example, be any of the three-dimensional printers described above.

The camera 202 may be any digital still camera, video camera, or other image sensor(s) positioned to capture images of the printer 200, or the working volume of the printer 200.

The processor 204, which may be an internal processor of the printer 200, an additional processor provided for augmented operation as contemplated herein, a processor of a desktop computer or the like locally coupled to the printer 200, a server or other processor coupled to the printer 200 through a data network, or any other processor or processing circuitry. In general, the processor 204 may be configured to control operation of the printer 200 to fabricate an object from a build material. The processor 204 may be further configured to adjust a parameter of the printer 200 based upon an analysis of the object in the image. It should be appreciated that the processor 204 may include a number of different processors cooperating to perform the steps described herein, such as where an internal processor of the printer 200 controls operation of the printer 200 while a connected processor of a desktop computer performs image processing used to control print parameters.

A variety of parameters may be usefully adjusted during a fabrication process. For example, the parameter may be a temperature of the working volume. This temperature may be increased or decreased based upon, e.g., an analysis of road dimensions (e.g. height and width of line of deposited build material), or the temperature may be adjusted according to a dimensional stability of a partially fabricated object. Thus, where sagging or other variations from an intended shape are detected, the temperature may be decreased. Similarly, where cooling-induced warping or separation of layers is detected, the temperature may be increased. The working volume temperature may be controlled using a variety of techniques such as with active heating elements and/or use of heated or cooled air circulating through the working volume.

Another parameter that may be usefully controlled according to the camera image is the temperature of a build platform in the working volume. For example, the camera 202 may capture an image of a raft or other base layer for a fabrication, or a first layer of the fabricated object, and may identify defects such as improper spacing between adjacent lines of build material or separation of the initial layer from the build platform. The temperature of the build platform may in such cases be heated in order to alleviate cooling-induced warping of the fabricated object at the object-platform interface.

Another parameter that may be usefully controlled according to an analysis of the camera image is the extrusion temperature of an extruder. By heating or cooling the extruder, the viscosity of a build material may be adjusted in order to achieve a desired material deposition rate and shape, as well as appropriate adhesion to underlying layers of build material. Where roads of material deviate from a predetermined cross-sectional shape, or otherwise contain visible defects, the extrusion temperature of the extruder may be adjusted to compensate for such defects.

Similarly, the parameter may be an extrusion rate of a build material from the extruder. By controlling a drive motor or other hardware that forces build material through the extruder, the volumetric rate of material delivery may be controlled, such as to reduce gaps between adjacent lines of build material, or to reduce bulges due to excess build material.

In another aspect, the parameter may be a viscosity of build material, which may be controlled, e.g., by controlling the extruder temperature or any other controllable element that can transfer heat to and from build material as it passes through the extruder. It will be understood that temperature control is one technique for controlling viscosity, but other techniques are known and may be suitable employed, such as by selectively delivering a solvent or the like into the path of the build material in order to control thermal characteristics of the build material.

Another parameter that may be usefully controlled is a movement speed of the extruder during an extrusion. By changing the rate of travel of the extruder, other properties of the build (e.g., road thickness, spatial rate of material delivery, and so forth) may be controlled in response to images captured by the camera 202 and analyzed by the processor 204.

In another aspect, the parameter may be a layer height. By controlling the z-positioning hardware of the printer 200, the layer height may be dynamically adjusted during a build.

The printer may include a memory 208, such as a local memory or a remote storage device that stores a log of data for an object being fabricated including without limitation a value or one or more of the parameters described above, or any other data relating to a print. The memory 208 may also or instead store a log of data aggregated from a number of fabrications of a particular object, which may include data from the printer 200 and/or data from a number of other three-dimensional printers.

A second processor 210, such as a processor on a server or other remote processing resource, may be configured to analyze the log of data in the memory 208 to identify a feature of the object that is difficult to print. For example, where a corner, overhang, or the like consistently fails, this may be identified by analysis of the log of data, particularly where such failures can be automatically detected based upon analysis of images from the camera 202. Such failures may be logged in any suitable manner including quantitatively as data characterizing the failure (based upon image analysis), metadata (e.g., percent completion, build parameters, and so forth) and/or a simple failure flag, which may be accompanied by an image of the failed build. In this manner, the second processor 210 can identify features that should be avoided in printable models, and/or objects that are generally difficult or impossible to print. The second processor 210 may also or instead be configured to analyze the results of variations in one or more of the parameters described above. It will be understood that, while the second processor 210 may be usefully located on a remote processing resource such as a server, the second processor 210 may also be the same as the processor 204, with logging and related analysis performed locally by the printer 200 or a locally coupled computer.

The printer 200 may optionally include a display 212 configured to display a view of the working volume. The display 212, which may obtain images of the working volume from the camera 202 or any other suitable imaging hardware, may be configured, e.g., by the processor 204, to superimpose thermal data onto the view of the working volume. This may, for example, include thermistor data or data from other temperature sensors or similar instrumentation on the printer 200. For example, the printer 200 may include sensors for measuring a temperature of at least one of the extruder, the object, the build material, the working volume, an ambient temperature outside the working volume, and a build platform within the working volume. These and any similar instrumentation may be used to obtain thermal data correlated to specific or general regions within and without the printer 200. Where the camera 202 includes an infrared camera, the thermal data may also or instead include an infrared image, or a thermal image derived from such an infrared image.

The display 212 may serve other useful purposes. For example, the view from the camera 202 may be presented in the display. The processor 204 may be configured to render an image of a three-dimensional model used to fabricate an object from the pose of the camera 202. If the camera 202 is a fixed camera then the pose may be a predetermined pose corresponding to the camera position and orientation. If the camera 202 is a moving camera, the processor 204 may be further programmed to determine a pose of the camera 202 based upon, e.g., fiducials or known, visually identifiable objects within the working volume such as corners of a build platform or a tool head, or to determine the pose using data from sensors coupled to the camera and/or from any actuators used to move the camera. The rendered image of the three-dimensional model rendered from this pose may be superimposed on the view of the working volume within the display 212. In this manner, the printer 200 may provide a preview of an object based upon a digital three-dimensional model, which preview may be rendered within the display 212 for the printer, or a user interface of the display, with the as-fabricated size, orientation, and so forth. In order to enhance the preview, other features such as build material color may also be rendered using texture mapping or the like for the rendered image. This may assist a user in selecting build material, scaling, and so forth for an object that is to be fabricated from a digital model.

In another aspect, the printer 200 may optionally include a sensor 214 for capturing three-dimensional data from the object. A variety of suitable sensors are known in the art, such as a laser sensor, an acoustical range finding sensor, an x-ray sensor, and a millimeter wave radar system, any of which may be adapted alone or in various combinations to capture three-dimensional data. The display 212 may be configured to superimpose such three-dimensional data onto the display of the object within the working volume. In this manner, the processor 204 may detect one or more dimensional inaccuracies in the object, such as by comparison of three-dimensional measurements to a digital model used to fabricate the object. These may be presented as dimensional annotations within the display 212, or as color-coded regions (e.g., yellow for small deviations, red for large deviations, or any other suitable color scheme) superimposed on the display of the object. The processor 204 may be further configured to show summary data in the display 212 concerning any dimensional inaccuracies detected within the object.

The sensor 214 may more generally include one or more spatial sensors configured to capture data from the object placed within the working volume. The second processor 210 (which may be the processor 204) may convert this data into a digital model of the object, and the processor 204 may be configured to operate the printer 200 to fabricate a geometrically related object within the working volume based upon the digital model. In this manner, the printer 200 may be used for direct replication of objects simply by placing an object into the working volume, performing a scan to obtain the digital model, removing the object from the working volume, and then fabricating a replica of the object based upon the digital model. More generally, any geometrically related shape may be usefully fabricated using similar techniques.

For example, the geometrically related object may be a three-dimensional copy of the object, which may be a scaled copy, and/or which may be repeated as many times as desired in a single build subject to spatial limitations of the working volume and printer 200. In another aspect, the geometrically related object may include material to enclose a portion of the object. In this manner, a container or other enclosure for the object may be fabricated. In another aspect, the geometrically related object may include a mating surface to the object, e.g., so that the fabricated object can be coupled to the original source object. This may be particularly useful for fabrication of snap on parts such as aesthetic or functional accessories, or any other objects that might be usefully physically mated to other objects. Similarly, a repair piece for a broken object may be fabricated with a surface matched to an exposed surface of the broken object, which surface may be glued or otherwise affixed to the broken object to affect a repair.

The processor 204 may obtain the digital model using, e.g., shape from motion or any other processing technique based upon a sequence of two-dimensional images of an object. The multiple images may be obtained, for example, from a plurality of cameras positioned to provide coverage of different surfaces of the object within the working volume. In another aspect, the one or more spatial sensors may include a single camera configured to navigate around the working volume, e.g., on a track or with an articulating arm. Navigating around the working volume may more generally include circumnavigating the working volume, moving around and/or within the working volume, and/or changing direction to achieve various poses from a single position. The one or more spatial sensors may also or instead include articulating mirrors that can be controlled to obtain multiple views of an object from a single camera.

In another aspect, the one or more spatial sensors 214 may include controllable lighting that can be used, e.g., to obtain different shadowed views of an object that can be interpreted to obtain three-dimensional surface data. The processor 204 (or the second processor 210) may also provide a computer automated design environment to view and/or modify the digital model so that changes, adjustments, additions, and so forth may be made prior to fabrication.

In another aspect, a tool head 220 of the printer may be usefully supplemented with a camera 222. The tool head 220 may include any tool, such as an extruder or the like, to fabricate an object in the working volume of the printer. In general, the tool head 220 may be spatially controlled by an x-y-z positioning assembly of the printer, and the camera 222 may be affixed to and moving with the tool head 220. The camera 222 may be directed toward the working volume, such as downward toward a build platform, and may provide a useful bird's eye view of an object on the build platform. The processor 204 may be configured to receive an image from the camera and to provide diagnostic information for operation of the three-dimensional printer based upon an analysis of the image.

For example, the diagnostic information may include a determination of a position of the tool head within the working volume. The diagnostic information may also or instead include a determination of whether the three-dimensional printer has effected a color change in build material. The diagnostic information may also or instead include a determination of whether the three-dimensional printer has effected a change from a first build material to a second build material. The diagnostic information may also or instead include an evaluation of whether a build material is extruding correctly from the tool head. The diagnostic information may also or instead include an evaluation of whether an infill for the object is being fabricated correctly. In one aspect, the diagnostic information may include the image from the camera, which may be independently useful as a diagnostic tool.

Where the processor 204 is capable of dynamically modifying tool instructions, the processor 204 may be configured to dynamically generate a pattern to infill the object based, for example, on an outline image of the object or previous infilling patterns identified in the image from the camera.

A variety of techniques are described below for providing an extrusion with a user-controlled color. In general, the various techniques described below address the difficulties of obtaining a uniform mixture of relatively high-viscosity build materials typically used in an extrusion-based process.

Figure 3:
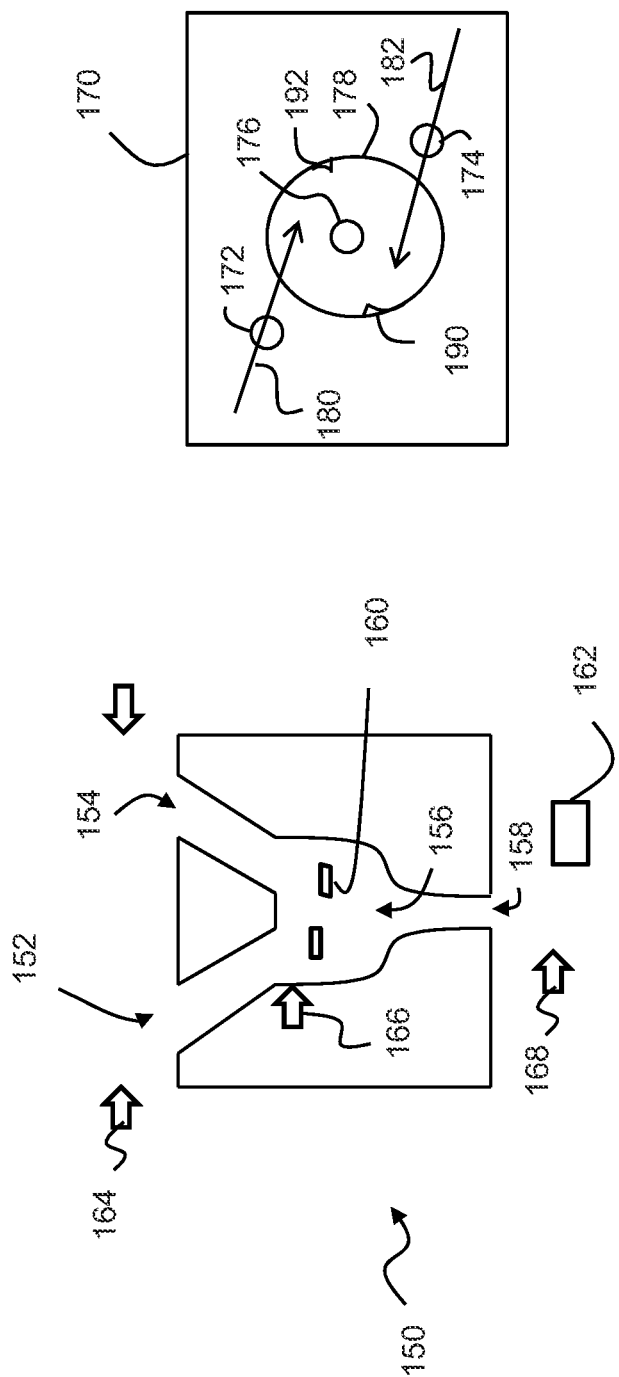
FIG. 3A shows a cross section of an extruder for a three-dimensional printer.
FIG. 3B shows a top view of the extruder of FIG. 3A.

FIG. 3A shows a cross section of an extruder for a three-dimensional printer. An extruder 150 such as any of the extruders described above may be adapted for color mixing by providing two entry ports, a first port 152 and a second port 154 that join through a cavity 156 that provides a shared mixing region coupled to an extrusion port 158 for a single output. One or more heating elements may be included around the cavity 156 to provide a melt zone that can liquefy build material supplied to the cavity 156 in solid form through the two entry ports. A variety of arrows are included in the figure illustrating points in the build material flow path where color might be usefully added to achieve color mixing. It will be understood that while two entry ports are shown, any number of ports, and any corresponding number of colored build materials may be used. For example, to provide output over a full color spectrum, three or more entry ports may be used, e.g., for red, green, and blue build materials, or cyan, magenta, yellow, white, and black build materials.

In one aspect the extruder 150 may include one or more baffles 160 within the cavity 156 to improve mixing. It will be appreciated that the term "baffle" as used herein is intended to describe any protuberance, cross-member, finger, or other physical feature within a flow path from the entry ports to the extrusion port that diverts or changes flow in a manner that encourages mixing of two different build materials. The cavity 156 may advantageously be manufactured as a two-part assembly to facilitate the creation (e.g., by machining or the like) or insertion (e.g., of cross-members) of any suitable features within the interior.

Thus in one aspect there is disclosed herein an extruder for use in an additive manufacturing system, the extruder comprising: a first port to receive a first filament of a first build material having a first color; a second port to receive a second filament of a second build material having a second color; an extrusion port; and a cavity coupled in fluid communication with the first port, the second port, and the extrusion port, the cavity including one or more baffles to mix the first build material with the second build material as it passes in a liquid state to the extrusion port. A heater may be included in the extruder to melt at least one of the first filament and the second filament prior to entering the cavity, or as at least one of the first filament and the second filament enter the cavity. More generally, a melt zone for the build material within the extruder may usefully begin anywhere prior to or at the point where two different build materials physically contact one another. At the same time, the melt zone may usefully begin as close to the cavity as practical so that the driving force of solid, unmelted build material can be most effectively transferred into the cavity. The interior cavity may advantageously have a small volume relative to the source material(s) and extruded material in order to reduce latency in a change from one color to another color at the extrusion port. For example, the small volume may be less than or equal to the diameter of the input filament(s) times the cross-sectional area of the filament, or less than two times the diameter times the cross-sectional area of the filament.

A pair of motors (such as filament drive motors) may be operable by a controller to independently drive the first filament into the first port and the second filament into the second port. The controller may control a feed rate of first filament and second filament to obtain a predetermined mixture of the filaments, or a predetermined color at the extrusion port. The predetermined color may be a user-selected color that is converted by the controller into drive speeds for the two motors based upon input materials having known color properties. In another aspect, a color sensor 162 such as a camera may be provided to detect a color of build material exiting the extrusion port, and the controller may adjust the feed rates to obtain the predetermined color. In another aspect, a color source such as a dye source may be provided so that color can be added to the first or the second filament as it feeds through the extruder. This may include a color source 164 that adds a color to an exterior of the filament in solid form (such as by painting or otherwise applying dye to the outside of the filament) and/or a color source 166 that injects a liquid into the filament as it liquefies or after it liquefies. The color source may add color under control of the controller to obtain a predetermined color for material exiting the extrusion port 158. In another aspect, a color source 168 may be positioned to apply a paint or the like as the build material exits the extrusion port 158, so that the extruded material is painted or otherwise colored immediately prior to deposition on a build.

FIG. 3B shows a top view of the extruder of FIG. 1A. The input axes for the two filaments into the cavity establish the direction at which solid material is driven into the cavity. These axes may be skewed relative to one another in order to encourage mixing of the materials in their liquid state. In this manner, for example, a rotational force may be imparted to two or more build materials as they are pushed together within the cavity 156 so that they tend to move in a vortex rather than linearly from entry to exit.

Thus in one aspect there is disclosed herein an extruder 170 for use in an additive manufacturing system, the extruder comprising: a first port 172 to receive a first filament of a first build material having a first color; a second port 174 to receive a second filament of a second build material having a second color; an extrusion port 176; and a cavity 178 coupled in fluid communication with the first port 172, the second port 174, and the extrusion port 176, wherein the first port 172 receives the first filament into the cavity on a first axis 180, and wherein the second port 174 receives the second filament into the cavity 178 on a second axis 182 that forms a skew line to the first axis where it enters the cavity. It will be appreciated that, while depicted in FIG. 1B as within the plane of the drawing, the axes 180, 182 would also be generally oriented downward in an extrusion path, i.e., from the ports 172, 174 on a top of the extruder 170 downward toward the extrusion port 176 on a bottom of the extruder as generally depicted in FIG. 1A. In this manner, sufficient force toward the extrusion port 176 can be generated to drive viscous build materials through the cavity 178 and out of the extrusion port 176. Features such as the distance offset of the two axes from the center and the angle offset of the two axes from vertical may be varied according to the viscosity of the build materials, the amount of mixing desired, the force required to extrude melted material through the output port and any other parameters, with suitable adjustments being within the ordinary skill in the art.

The baffles described above may include spiral ridges 190 or other torsion inducing elements 192 along interior walls of the cavity to swirl build materials down toward the extrusion port. A variety of geometric configurations may be used for such spiral ridges, including various pitches (distance from one turn to the next) and various heights (amount that ridge protrudes into build cavity).

Thus in one aspect there is disclosed herein an extruder for use in an additive manufacturing system, the extruder comprising: a first port 172 to receive a first filament of a first build material having a first color; a second port 174 to receive a second filament of a second build material having a second color; an extrusion port 176; and a cavity 178 coupled in fluid communication with the first port 172, the second port 174, and the extrusion port 176, the cavity 178 having an interior wall with a tapered (e.g., from a wider top of the cavity to a narrower bottom of the cavity), torsion inducing element 192 to mix the first build material with the second build material while passing in a liquid state to the extrusion port.

In one aspect mentioned above, the extruder may provide color control by applying paint or other dye(s) directly to build material as it exits an extrusion port. More generally, a paint tool may be included in a tool head with the extruder, and paint may be applied after material is deposited on an object that is being fabricated. In this manner, small, controlled doses of paint may be applied to a road of deposited material to impress a desired color or combination of colors onto the fabricated object.

Thus in one aspect, there is disclosed herein an additive fabrication system comprising: an extruder configured to extrude a build material at a controlled volumetric rate in a liquid state; an x-y-z positioning system configured to controllably position the extruder within a build volume; a paint head (e.g., the color source 168 in FIG. 1A) having a controllable pose, the paint head configured to apply a controlled color of paint to a surface through a nozzle; and a processor coupled in a communicating relationship with the extruder and the x-y-z positioning system and configured to fabricate a three-dimensional model in the build volume from the build material of the extruder, the processor further configured to position and orient the nozzle of the paint head toward a predetermined location on an exterior surface of the object during fabrication of the exterior surface and to apply paint having a computer controlled color at the predetermined location. More particularly, the predetermined location may be a location immediately behind the extruder on a current deposition path. That is, where the extruder moves in an x-y direction, the paint head may be directed to an immediately trailing location, which direction may change as the path of the extruder changes.

In another aspect, an injector such as the color source 166 may be provided to inject dyes or other coloring agents directly into the interior cavity of the extruder.

Thus in one aspect there is disclosed herein a system for additive fabrication with color control, the system comprising: a filament of a build material; a supply of one or more additives; an extruder having a port to receive the filament, an extrusion port, and a cavity coupling the port in fluid communication with the extrusion port; and an injector coupled to the cavity, the injector configured to inject a controllable amount of the one or more additives from the supply into the cavity.

The system may include a motor that supplies mechanical force to drive the filament into the port. The system may include a heater that provides thermal energy to melt the filament in the cavity. The one or more additives may include one or more dyes such as a non-soluble encapsulated pigment. Thus, for example, dye may be encapsulated in an opaque capsule that can be ruptured under controlled circumstances to impart a resulting color according to, e.g., temperature, pressure, ultrasonic stimulus, or other chemical, mechanical, or optical stimuli. The system may include a controller to select the controllable amount of the one or more dyes to obtain a build material having a predetermined color from the extrusion port. The cavity may include one or more baffles that mix the build material with the one or more dyes prior to extrusion as generally described above.

In another aspect, feedback may be used to obtain a target color. For example, the color sensor 162 may be used to measure an output color from the extrusion port 176, which measurement may be provided as a signal to the controller that can responsively control various color sources to change the output color.

Thus in one aspect there is disclosed herein an additive fabrication system comprising: a build material provided as a filament; an extruder having a port to receive the filament, an extrusion port, and a cavity that couples the port in fluid communication with the extrusion port; a motor configured to provide a force to drive the filament into the port; a heater positioned to melt the build material within the cavity; a pigment source adapted to deliver a pigment to the build material; a sensor positioned to detect a color of the build material exiting the extrusion port; and a controller programmed to receive data from the sensor and to control operation of the motor, the heater, and the pigment source to achieve a predetermined color for the build material exiting the extrusion port.

The predetermined color may be a user-defined color, such as by directly specifying color as an input to tool path creation, or as a tool instruction within tool instruction for a print. The predetermined color may also or instead be obtained from a three-dimensional model such as a source CAD model. The sensor may be a video camera. The pigment source, which may be any of the color sources described above, may deliver pigment to melted build material within the cavity, or the pigment source may apply pigment to the filament before the filament enters the cavity. The cavity may include one or more baffles to mix the pigment with the build material.

It will be understood that the methods and systems described above may be generalized to provide multi-material mixing for properties other than color, such as by adding and/or mixing materials for desired thermal properties, mechanical properties, electrical properties, optical properties, and so forth.

Additionally, a variety of active mixing techniques may be usefully employed. Characteristics of viscous mixing, and techniques for same, are well known in the art and may be employed in a mixing system as contemplated herein. For example, mixing of highly viscous fluids is described in Handbook of Industrial Mixing: Science and Practice, pp. 987-1025 (Ch. 16 (Mixing of Highly Viscous Fluids, Polymers, and Pastes), Todd, D. B. (2004), the entire content of which is hereby incorporated by reference. A variety of mixing tools such as a helical blade mixer, a change can mixer, a double arm kneading mixer, a continuous mixer, a single-screw extruder, a Banbury mixer, a plow mixer, a ribbon mixer, a cone and screw mixer, twin-screw extruders (e.g., tangential counter-rotating, intermeshing counter-rotating, intermeshing co-rotating), a Farrel continuous mixer, may be used alone or in combination to facilitate mixing of highly viscous materials. Similarly, a number of mixing enhancers are known in the art that might be usefully employed to improve mixing such as parallel interrupted mixing flights, a ring barrier, mixing pins, a Maddock mixing section, hexalobal mixing screws, kneading paddles, and so forth. Any of the foregoing might be usefully adapted to provide active mixing of viscous build materials within a cavity.

Figure 4:
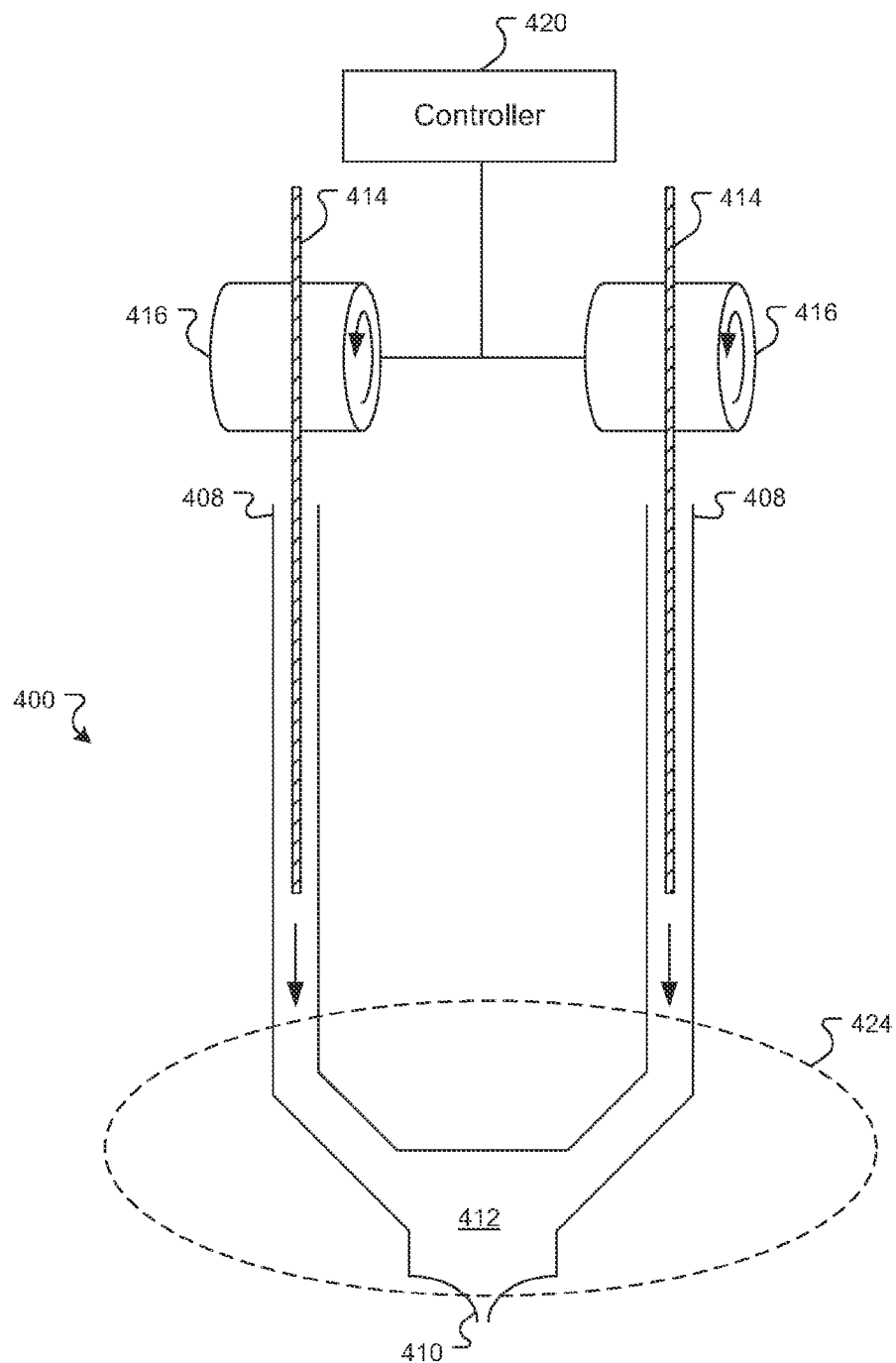
FIG. 4 shows an extruder for use in a three-dimensional printer.

FIG. 4 shows an extruder for use in a three-dimensional printer. The extruder 400 may include two or more entry ports 408. Each entry port 408 can receive a filament of build material 414 that is driven by a motor 416 towards a cavity 412. The extruder 400 may include (or may be in thermal contact with) one or more heaters that are operable to create a melt zone 424, where build material 414 is likely to begin melting. In some implementations, the melt zone 424 may be coextensive with the cavity 412. In some implementations, the melt zone may extend beyond the cavity towards the entry ports 408, so that build material 414 is likely to be melted before it enters the cavity 412.

Each motor 416 may be individually controllable through the controller 420 to adjust the rate at which it operates. By feeding the build material 414 into the cavity at different rates, the resultant build material may take on a range of colors. For example, using yellow and blue build material in equal proportions, a green build material can be produced, and the hue may be varied by feeding yellow at a greater or lesser volumetric rate into the cavity 412.

Figure 5:
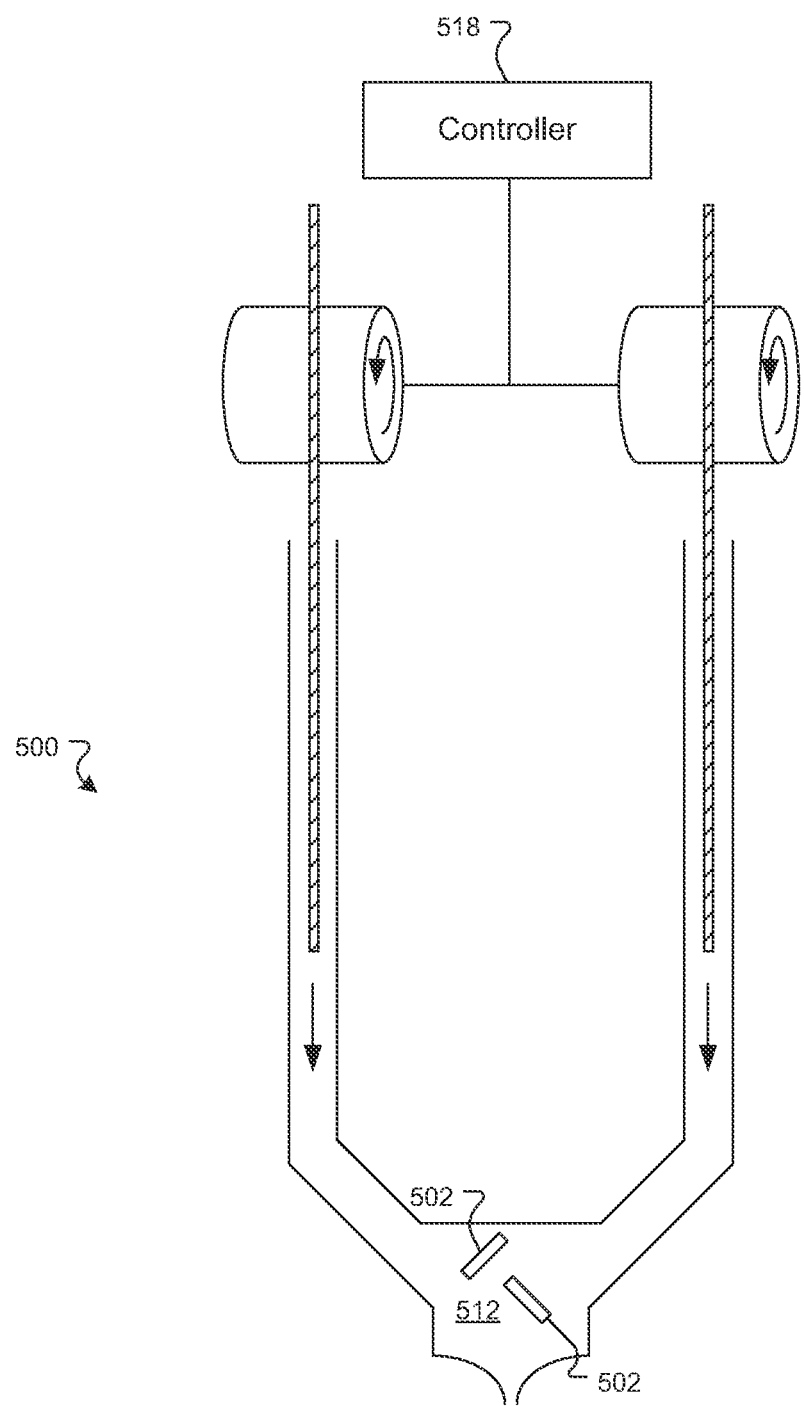
FIG. 5 shows an extruder for use in a three-dimensional printer.

FIG. 5 shows an extruder for use in a three-dimensional printer. The extruder 500 may include one or more baffles 502 as described above. In some implementations, baffles 502 can include passive, fixed structures that alter the flow of melted build material, thereby promoting mixing. In some implementations, the baffles 502 can include active structures (e.g., as described above) that further promote mixing. Where active structures are used, they may operate under control of the controller 518, or another controller, or autonomously such as by driving the active structure(s) (such as a mixing impeller or the like) at a fixed rotational speed whenever extruding, or at a rotational speed proportional to an average of the two or more motors that drive the filament.

Figure 6:
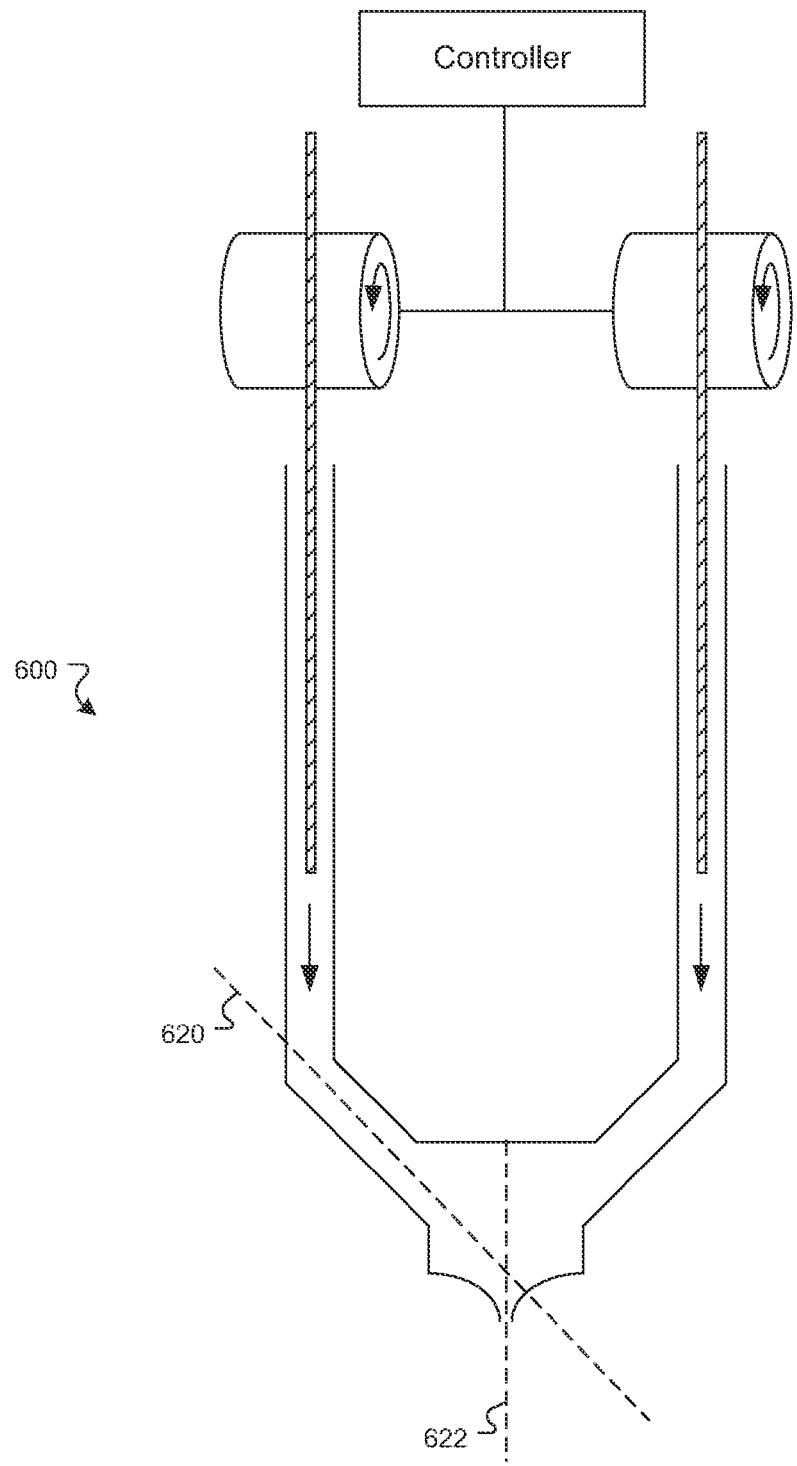
FIG. 6 shows an extruder for use in a three-dimensional printer.

FIG. 6 shows an extruder for use in a three-dimensional printer. The extruder 600 may be constructed such that an in-feed axis 620 of one or more build materials is skewed (i.e., not parallel) with respect to an extrusion axis 622. In some embodiments, the in-feed axes 622 of the various build materials are skewed with respect to each other, and/or with respect to the extrusion axis 622. The skewed axes may promote color mixing by imparting mixing forces to rotate or swirl the several build materials within the cavity prior to extrusion. While the optimum orientation of these axes will depend upon the shape of the cavity, the viscosity of the build materials, the presence or absence of additional baffles or the like within the cavity, and other geometric properties of the extruder and physical properties of the build materials, a suitable rotational path within the cavity may generally be established be skewing the axes with an angular offset to a vertical axis of the extruder and a radial offset on opposing sides of a center axis of the cavity as illustrated for example in FIG. 3B. In this manner, lateral mixing forces may be created within a plane of the cavity.

Figure 7:
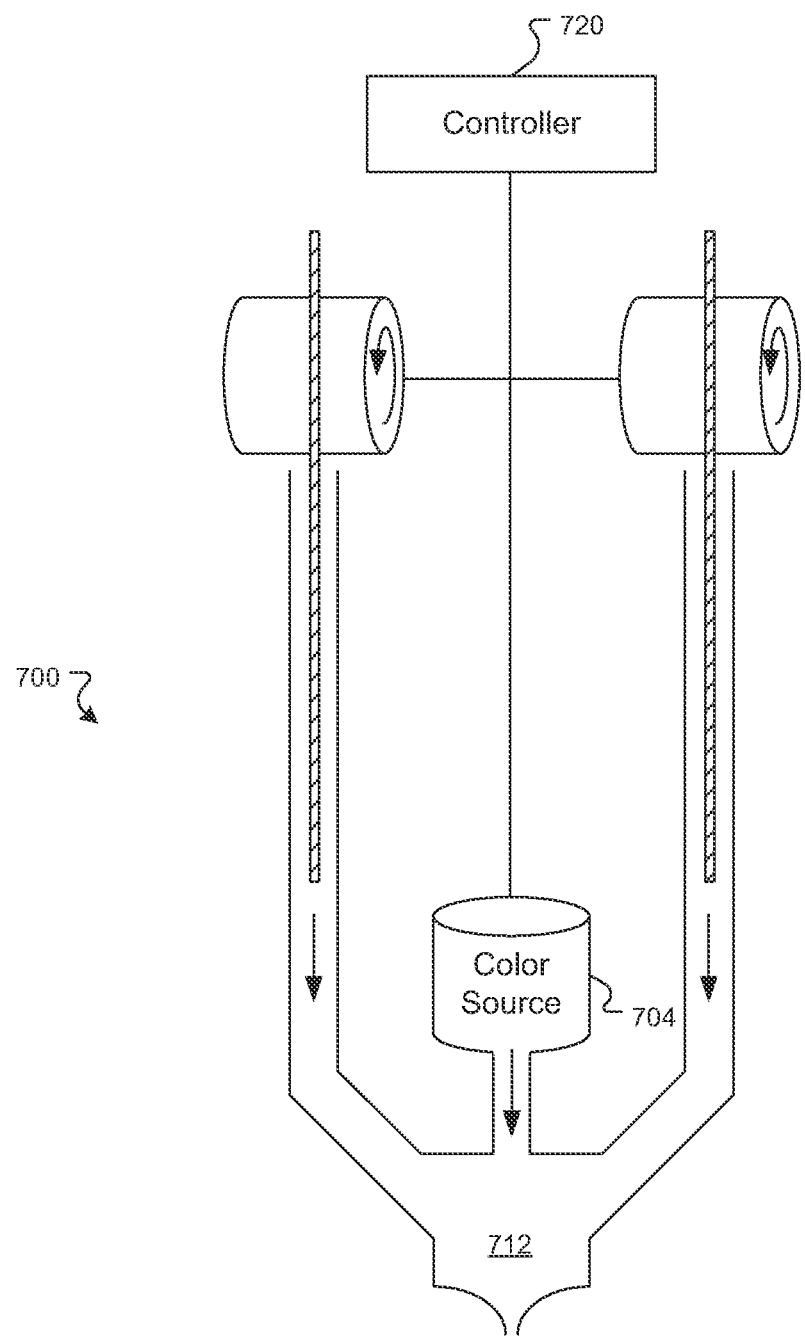
FIG. 7 shows an extruder for use in a three-dimensional printer.

FIG. 7 shows an extruder for use in a three-dimensional printer. The extruder 700 may be constructed such that the cavity 712 is in fluid communication with one or more color sources 704. The color source 704 may selectively, under control of the controller 720 and as described more fully herein, inject a color additive into the cavity 712. Thus while one or more motors 716 drive build material into the cavity 712, the color source 704 may also provide any suitable colorant to the build material. Such color additives may include inks, dyes, pigments, gels, photoreactive reagents, and the like that may alter a color of the melted build material (s) in the cavity 712. The color alteration may be immediate, or may be delayed (e.g., the color alteration may occur due to a slow or delayed chemical reaction, exposure to ultraviolet light, changes in temperature, and so forth). While the build materials may also be colored, and the color source 704 may supplement such colored build materials to provide a greater range of possible output colors, it will be appreciated that the color source 704 may also be usefully employed in a system that uses only a single-colored build material, such as a white or other neutral-colored build material. In this context, the two different input feeds for identically-colored or similarly-colored materials may nonetheless be usefully employed to create a mixing action within the cavity as described above in order to mix additives from the color source 704 with the melted build material. For a single-feed device, a single axis angled to and radially offset from the vertical axis of the extrusion port may also or instead be employed to create mixing forces within the cavity.

Figure 8:
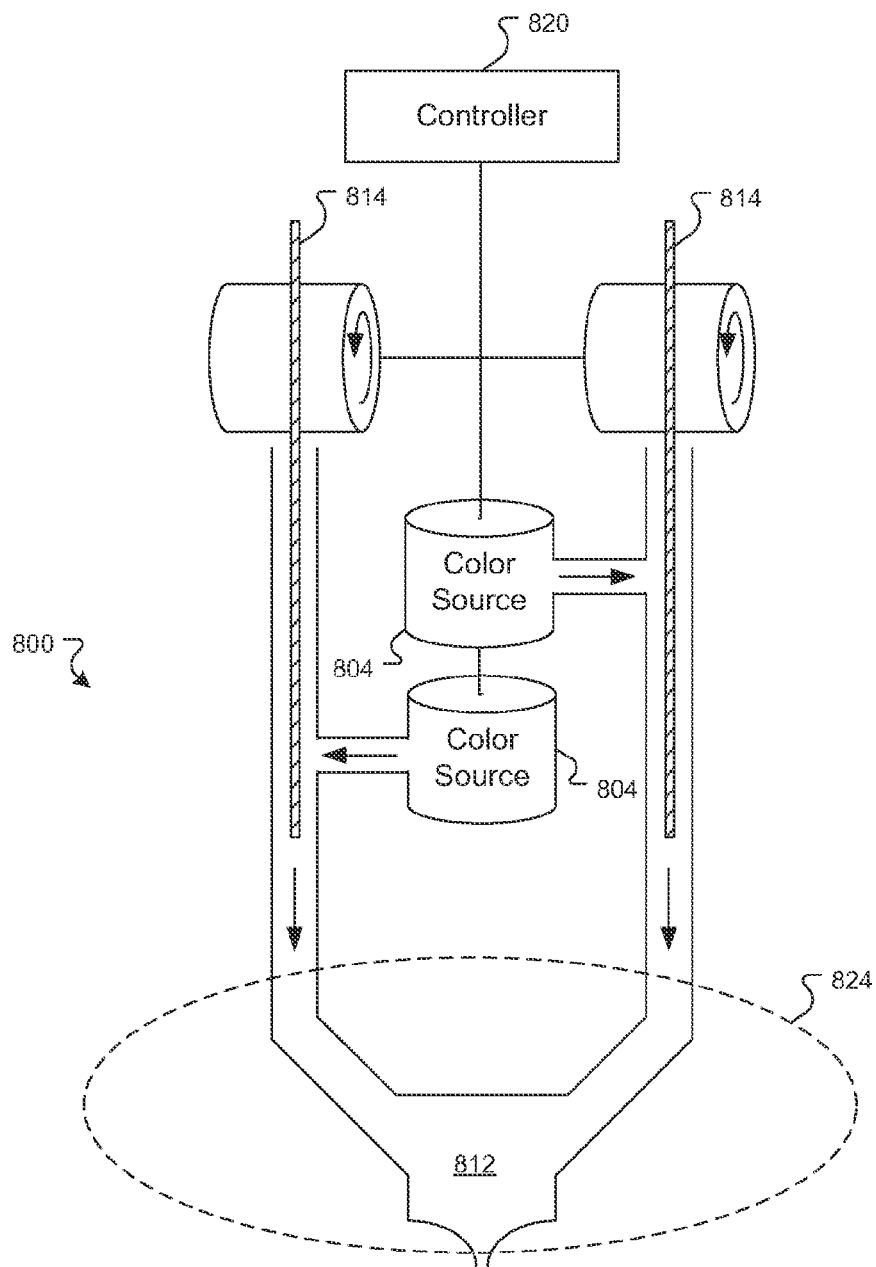
FIG. 8 shows an extruder for use in a three-dimensional printer.

FIG. 8 shows an extruder for use in a three-dimensional printer. The extruder 800 may provide a feed path for build materials that is coupled to one or more color sources 804, such that color additives may be applied to solid build material before build material 814 enters either the melt zone 824 or the cavity 812. The color source 804 may, for example, include paints or liquid dyes applied to an exterior of the un-melted build material. In some implementations, the color additives may be injected inside the melt zone 824, but before the cavity 812. The color sources 804 may be controlled by a controller 820, as described more fully herein.

Figure 9:
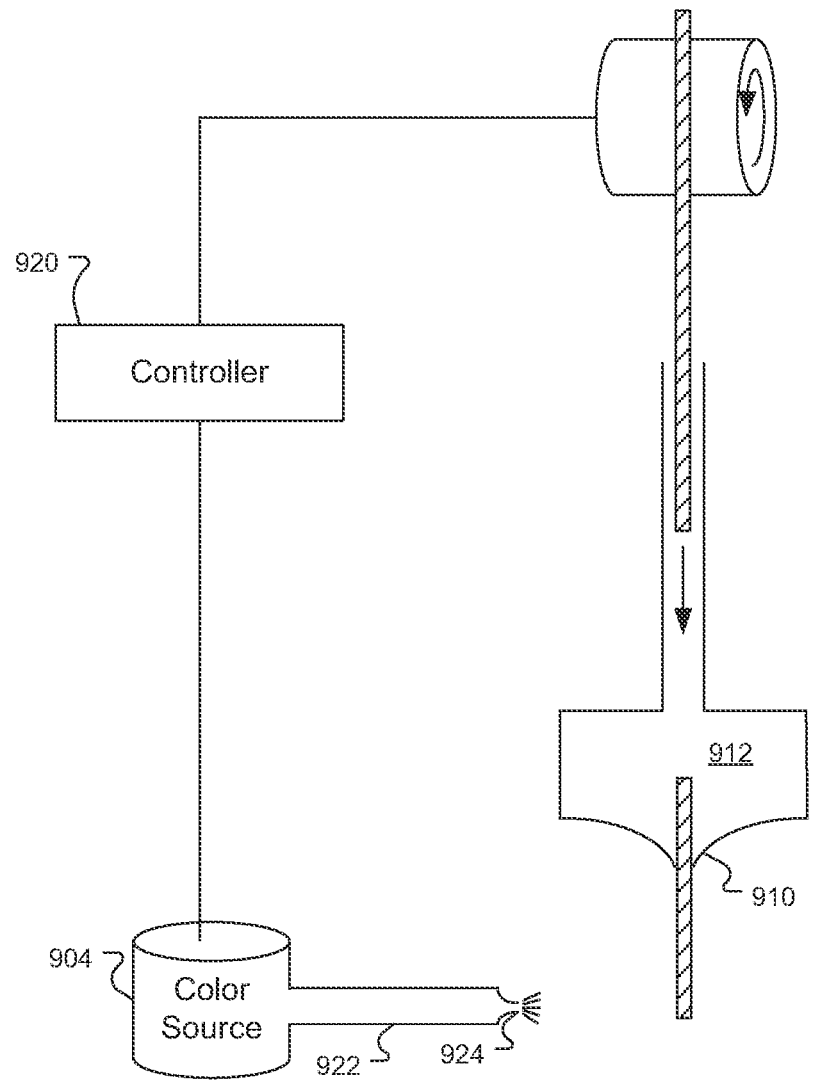
FIG. 9 shows an extruder for use in a three-dimensional printer.

FIG. 9 shows an extruder for use in a three-dimensional printer. As shown in FIG. 9, one or more color sources 904 may deliver color additives to build material as it exits the extruder at an extrusion port 910. The color source 904 may be mounted on an x-y-z positioning system that, under the control of a controller 920, may take on any pre-determined position and pose within the build volume of the three dimensional printer. Thus, the color source may be controlled to deposit color agents on the surface of the object (or on material as it is being deposited on the surface) either during or after fabrication. In some implementations, the color agents include paint, and the color source may include a paint head 922 and a nozzle 924 configured to apply the paint under control of the controller 920. In one aspect, this includes a nozzle 924 that is controllably directed toward a trailing point a predetermined distance behind a current position of the extruder along an extrusion path.

Figure 10:
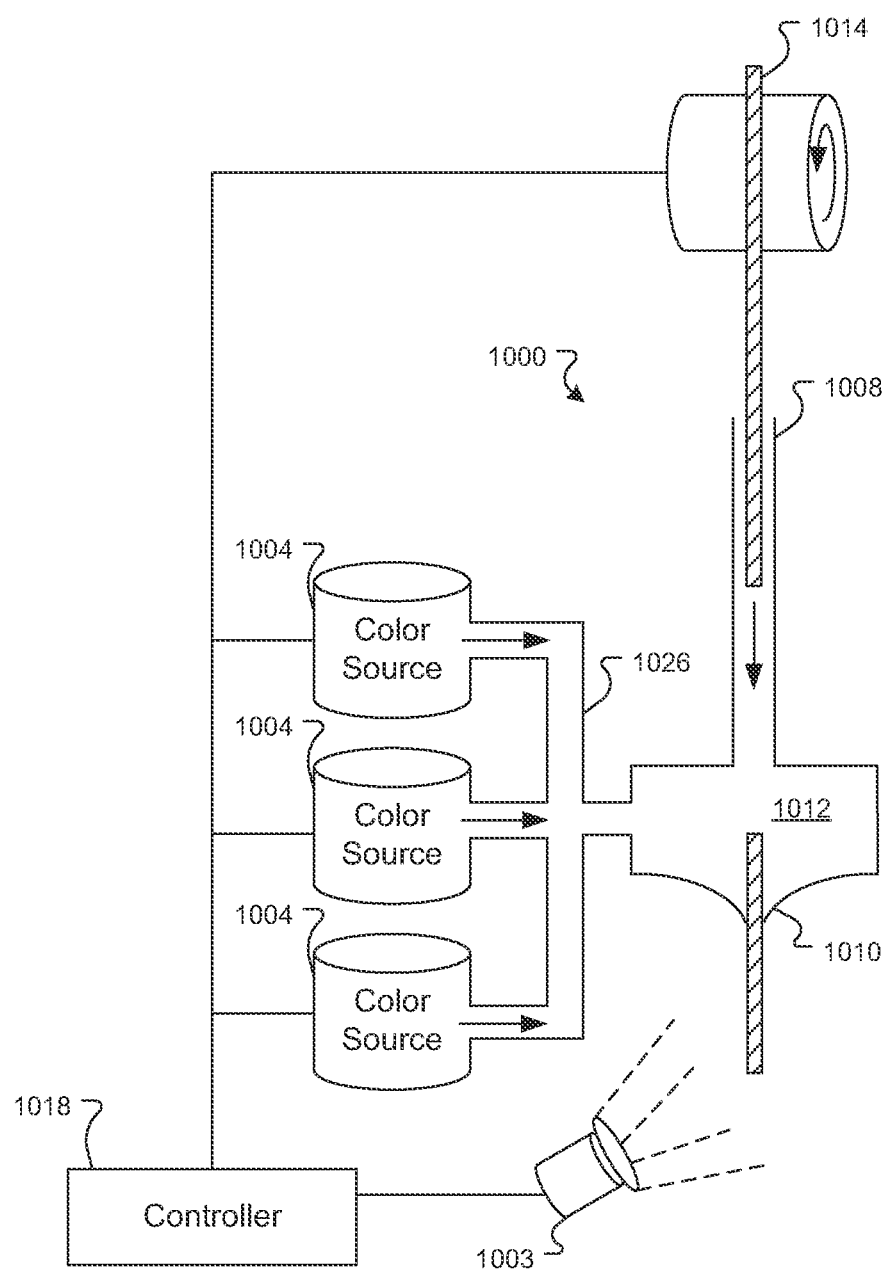
FIG. 10 shows an extruder for use in a three-dimensional printer.

FIG. 10 shows an extruder for use in a three-dimensional printer. The extruder 1000 may include one or more entry ports 1008 configured to accept a filament of build material. A feedpath of the extruder 1000 may be in fluid communication with one or more color sources 1004. The fluid communication can be implemented in any way as described above; e.g., the color additives may be added to the build material before or after the build material enters the cavity 1012 where the build material is liquified. Alternatively or additionally, the color additives may be deposited directly on the build material as it exits the extrusion port 1010. In some implementations, the individual color sources 1004 are configured to inject color additives into a manifold 1026 or other region prior to entering the extruder 1000. This may help promote even mixing of the various color additives prior to mixing with the build material. The manifold 1026 may include any number of active or passive mixing structures to combine color additives from the number of color sources 1004.

The color additive(s) may be injected under control of a controller 1018. The controller 1018 may also be in data communication with a color sensor 1003, which may be a color camera or any other suitable instrumentation with spectrographic capabilities. The color sensor 1003 may be positioned to detect the color of the build material as it exits the extrusion port 1010. Thus, for a camera, the camera may be directed so that a field of view of the camera includes the extrusion port 1010 and material exiting therefrom. This information can be used to advantageously control the injection of color additives. For example, a deviation between a sensed color from the color sensor 1003 and an expected color, e.g., a predetermined color determined based upon controlled dispensation from the color sources 1004, can be incorporated into a mathematical function or lookup table to correct or update the controller's instruction to the other motors, color sources, or other components. A suitable mathematical function may be derived based upon a deviation between a sensed color and an expected color. For example, a deviation in color may be represented as a vector in a color space that includes, e.g., a multi-dimensional hue and a saturation. Suitable corrective action may be determined to reduce or eliminate this deviation vector and converted into machine instructions for execution by a printer.

Figure 11:
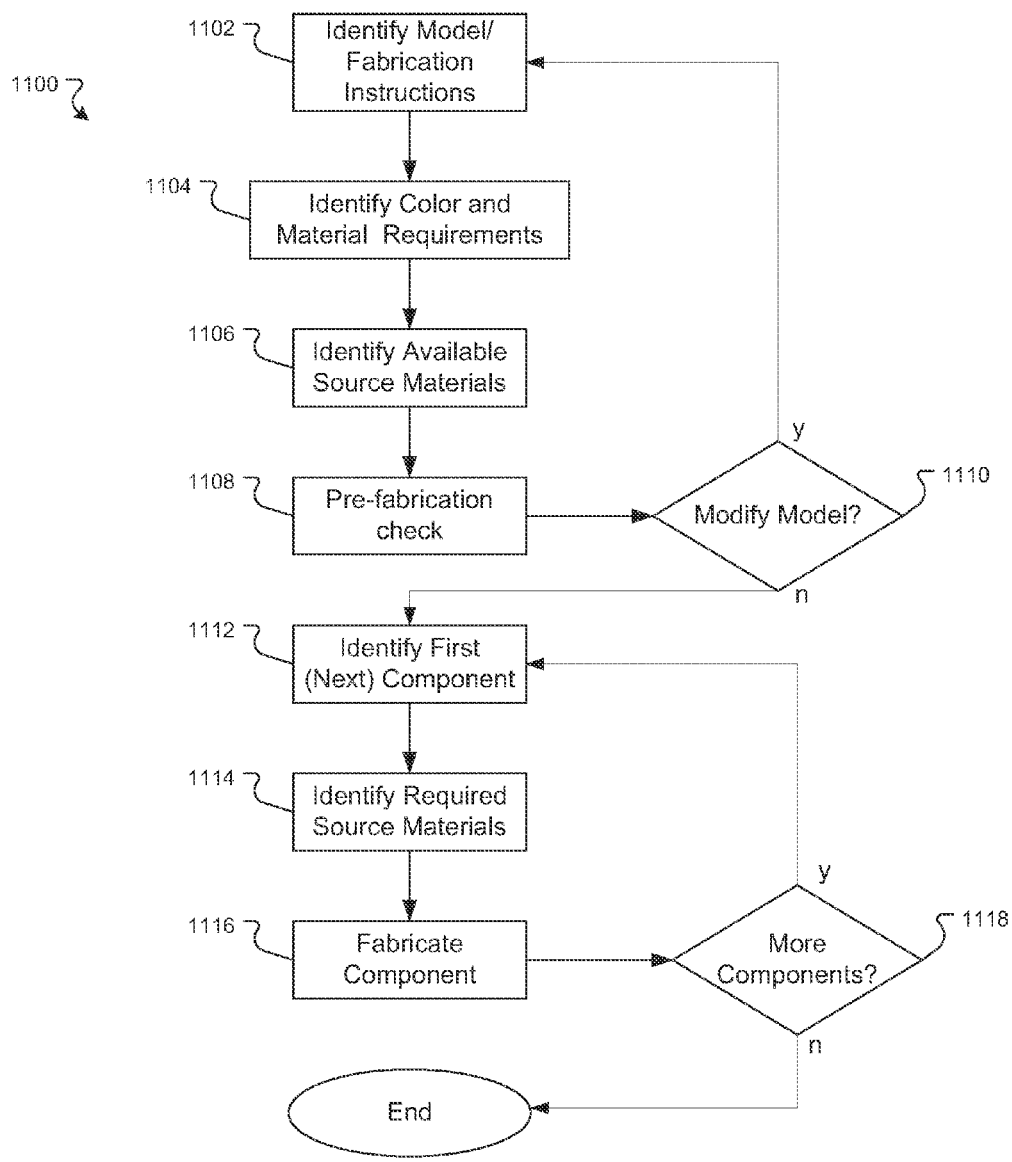
FIG. 11 is a flowchart for fabricating an object.

FIG. 11 is a flowchart for fabricating a colored object. The method 1100 may begin by identifying a model for the object and/or fabrication instructions for the object (step 1102). An object model may be any computer-readable file or files that collectively specify the structure and colors of the object. This may, for example include CAD files, STL files, and the like that provide three-dimensional descriptions of the object. This may also include image files such as PNG files, JPEG files, IMG files, and the like, which may be texture mapped or otherwise applied to surfaces of three-dimensional models, e.g., in the CAD or STL files, to characterize color over the surface of the object.

Fabrication instructions corresponding to a model may be any collection of instructions that, when carried out by a three dimensional printer, result in the fabrication of the object. For example, fabrication instructions may include a series of instructions for moving to various x,y,z coordinates, extruding build material, controlling temperature of heating elements, etc. For example, gcode is one common format for providing fabrication instructions to operate a three-dimensional printer, although any form of machine-executable instructions may also or instead be used, including instructions that directly encode hardware functions such as stepper motor positions, or instructions that are interpreted by other printer hardware to provide a specified result.

In step 1104, the color and material requirements for fabricating the object may be identified. For example, in step 1104 it may be determined that a particular object requires a first amount of green build material, a second amount of yellow build material, a third amount of cyan color additive, etc. The color and material requirements may be identified in several ways. In some implementations, these requirements may be identified from a "virtual fabrication," in which fabrication instructions are processed in memory of a computer, while totals of the various materials are tracked. In some implementations, the requirements may be determined from the object model using standard geometric computations. In some implementations, the requirements may be contained in metadata of the object model, fabrication instructions, or a related file.

In step 1106, the types, amounts, and colors of available build materials may be identified. In some implementations, a user (e.g., an operator of the three dimensional printer) may be directly queried as to what build materials are available. In some implementations, a system (e.g., the controller of the three dimensional printer or a remote computer) automatically tracks material usage and updates material inventory with respect to an initial inventory. In another aspect, predetermined values may be obtained from computer memory and used in subsequent processing. For example, a printer may have four feedpaths intended for specific colors of red, green, blue, and white build material. The intended color of each material may be stored and associated with a particular drive motor or the like. When determining colors for a build, or when adjusting an output color, the controller may reference the stored color value for corresponding calculations. Similarly, a user may manually enter a color value for each build material or color source.

In step 1108, a pre-fabrication check may be performed. The pre-fabrication check may compare the color and material requirements to the available build materials. A safety factor may be used to account for print errors, waste, or other process variations.

In decision 1110, it may be determined whether the model should be modified, e.g., by comparing data on source materials with a model to be fabricated. In some implementations, the user is alerted to a condition in which the available build materials are not sufficient to meet the color and material requirements. For example, the available build materials may include only yellow and blue filaments, while a model calls for certain portions to be red. Insofar as there is no way to obtain red from mixing yellow or blue in any proportion, the build materials are inadequate for that particular model. As another example, the available build materials may include 50 grams of a certain shade of yellow filament and 70 grams of a certain shade of blue filament, and the fabrication instructions may require 120 grams of a shade of green filament that can be obtained from mixing the yellow and blue filament in equal proportions. In this case, although there is enough material (irrespective of color) to fabricate the object, there is not enough yellow filament to obtain the color specified in the model. As another example, the object may require 120 grams each of yellow and blue filament to be mixed in equal proportion, but there only 100 grams of yellow and blue filament available. In this case, the desired color is obtainable, but there is not enough build material to fabricate the object.

It is possible for the available build materials to be inadequate in other ways. If the available build materials are inadequate, a user may be notified. In some implementations, the user is notified of the particular missing resources. (E.g., the user may be informed that 10 more grams of yellow filament are needed.) In some implementations, if the available build materials are inadequate, the model may be automatically modified in various ways as described more fully below. In some implementations, the model may be manually modified by the user. In another aspect, a number of recommendations may be made for changes to scaling, color or the like to conform the object to available build materials, and a user may be prompted to select one or more such recommendations. In still other implementations, the process 1100 may be paused or canceled so the user can obtain adequate build materials. More generally, where a need for modification is identified, the model may be manually, semi-automatically, or automatically revised according to available materials, and the method may return to step 1102 so that another pre-fabrication check can be performed.

If the model is not modified, a first component of the object is identified (step 1110). In this context, a "component" is intended to refer to a contiguous length of same-color build material. The length of material or "component" need not be used to form a single structure, and may be used to fabricate two or more physically disconnected structures. However, it is generally contemplated that this length of material would be extruded or otherwise deposited as a specified color without any changes to the color along its length.

In step 1112, the required build materials to produce the specified color are identified. For example, if a specified color is obtainable from a particular proportion of two or more available build materials, that proportion is identified. It may occur that there are multiple combinations of build materials that yield the color specified by the model. In this case, any suitable criterion for deciding which combination to use can be employed. Such criteria can include, for example, minimizing a total cost of the build materials, minimizing a fabrication time, a user-supplied preference for certain build materials to be used over others, or some other criterion.

In step 1114, the component, e.g., single-color portion, of the model may be fabricated using the combination of build materials identified in the previous step. At the completion of the component's fabrication, it is determined whether there are more components in the model (decision 1118). If so, the next component is identified and steps 1112-1116 are performed again. If there are no more components, the object has been fabricated and process 1100 ends.

Figure 12:
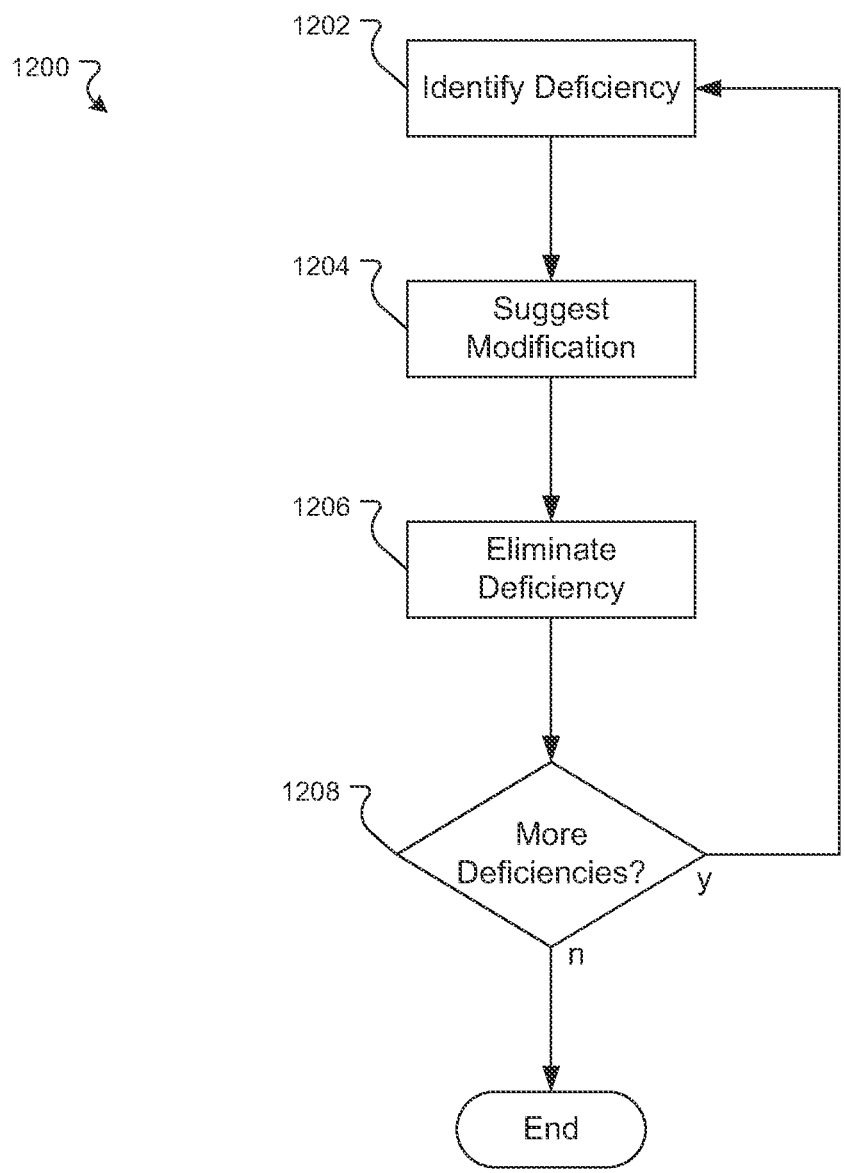
FIG. 12 is a flowchart for modifying an object model.

FIG. 12 is a flowchart for modifying an object model. The process 1200 may be performed, for example, when a preliminary check (FIG. 11, step 1108) reveals that there are insufficient build materials or color source materials to fabricate the object of the existing model.

In step 1202, a deficiency amongst the build materials is identified. For example, the deficiency may be that there is an insufficient amount of a particular build material (e.g., of a particular color). In another example, the deficiency may be that a color specified by the model cannot be obtained from the available colors of the build materials. In another example, the deficiency may be that there is an insufficient amount of build material, irrespective of color.

For a given deficiency, a suggested modification is presented (step 1204). One type of modification may include altering a color in the model (or portion thereof) such that the modified colors may be produced from the available build materials.

In one example, suppose the modeled object is composed entirely of a shade of green that results from mixing an available yellow filament and an available blue filament in equal proportions. Moreover, suppose fabricating the object of the model involves 100 grams of filament total, but only 40 grams of yellow filament and 60 grams of blue filament is available. In this case, the green of the model can be modified to a shade of blue-green; specifically, the shade that would result if the available yellow and the available blue were mixed in a 2:3 ratio.

In another example, suppose the modeled object includes some structures that are red, but the only available build materials are blue and yellow. In this case, a closest color obtainable from the build materials may be identified. In this case, a user may be presented with options for alternative colors that can be fabricated from available materials. For example, a user may be presented with a color palette showing a convex hull of the available colors, and prompted to identify a point on the convex hull for use in fabricating the object or a portion of the object. The color palette may include an identifier showing a location within the convex hull that minimizes the distance from the available colors to the color of the model. Other criteria may be used when suggesting a color. For example, the suggested color may be a color that favors a particular build material based on, e.g., availability, cost, predetermined user preference, and so forth. In another aspect, the user interaction may be omitted, and the method 1200 may include selecting an available color closest to the intended color.

Another type of modification is to scale the object itself, so that it can be fabricated with the original colors using the available build materials. In the example above (in which the original model involves 100 grams of green material, but only 40 grams of yellow and 60 grams of blue are available), then scaling the object by 80% would reduce the required amount of yellow to 40 grams, thus allowing the object to be fabricated using the original colors.

In addition to or instead of these modifications, the user may make manual modifications to the model, for example using the various design tools described herein, and may retest the modified model for errors or deficiencies.

Combinations of these modifications are possible.

Once a modification eliminates a deficiency (step 1206) it is determined whether there are any remaining deficiencies (decision 1206). If there are, the next deficiency may be identified and eliminated. If no deficiencies remain, process 1200 concludes.

Figure 13:
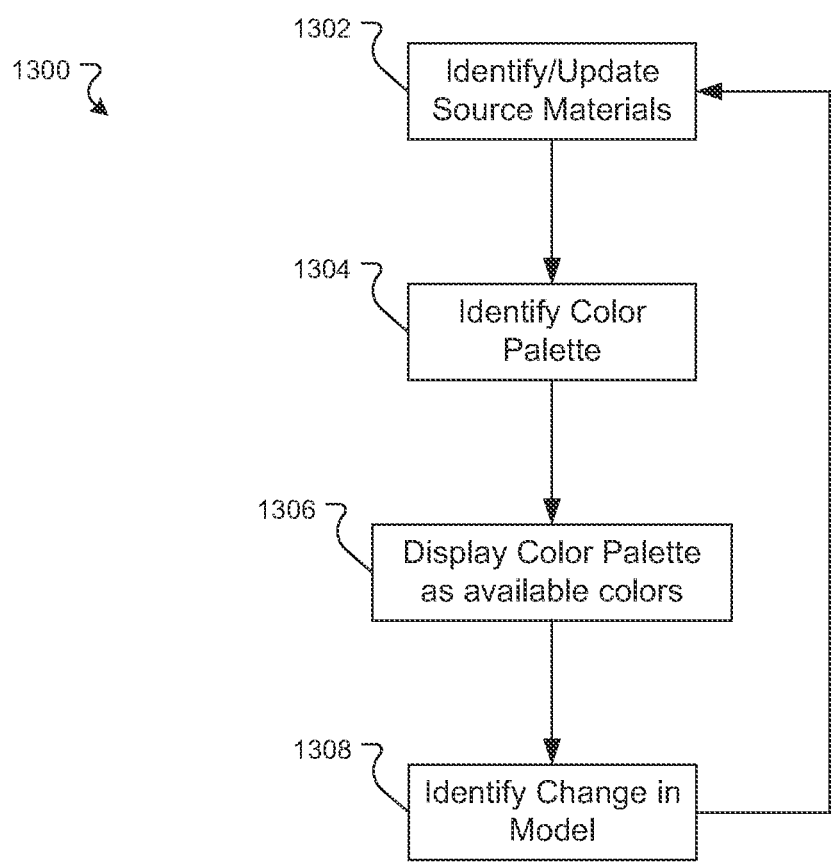
FIG. 13 is a flowchart for providing a design tool.

FIG. 13 is a flowchart for providing a design tool. The design tool may include any software and corresponding user interface capable of rendering or manipulating three-dimensional models of the type described above. The process 1300 may begin by identifying available build materials for fabricating an object, as described above (step 1302). In step 1304, a color palette may be identified from the available build materials. The color palette may include various colors (or shades thereof) that can be produced from the available build materials (including dyes or other additives from the various color sources described above). In some implementations, the color palette may include those points in color space falling in the interior (or on the boundary) of the convex hull of the available source colors, or some two-dimensional aspect of a multi-dimensional convex hull.

In step 1306 the color palette may be displayed to a user of the design tool as available colors to use in the model. In some implementations, the user may be limited when developing the model to only those colors in the color palette. In some implementations, the user may be permitted to use colors outside the color palette, but will be warned that he is doing so. At step 1308, a change in the model is identified (e.g., received from the user). For example, the change can include changing the color of a structure, adding a new structure, deleting an existing structure, or the like.

The process 1300 may then return to step 1302, in which the inventory of available build material is updated based on the change of step 1308. For example, if there are precisely 30 grams of a particular color available and the user creates a new structure using all 30 grams, then the available build material inventory is updated to reflect that the 30 grams is no longer available, and that color is removed from the color palette.

The methods or processes described above, and steps thereof, may be realized in hardware, software, or any combination of these suitable for a particular application. The hardware may include a general-purpose computer and/or dedicated computing device. The processes may be realized in one or more microprocessors, microcontrollers, embedded microcontrollers, programmable digital signal processors, or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as computer executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, means for performing the steps associated with the processes described above may include any of the hardware and/or software described above. All such permutations and combinations are intended to fall within the scope of the present disclosure.

It should further be appreciated that the methods above are provided by way of example. Absent an explicit indication to the contrary, the disclosed steps may be modified, supplemented, omitted, and/or re-ordered without departing from the scope of this disclosure.

The method steps of the invention(s) described herein are intended to include any suitable method of causing such method steps to be performed, consistent with the patentability of the following claims, unless a different meaning is expressly provided or otherwise clear from the context. So for example performing the step of X includes any suitable method for causing another party such as a remote user or a remote processing resource (e.g., a server or cloud computer) to perform the step of X. Similarly, performing steps X, Y and Z may include any method of directing or controlling any combination of such other individuals or resources to perform steps X, Y and Z to obtain the benefit of such steps.

While particular embodiments of the present invention have been shown and described, it will be apparent to those skilled in the art that various changes and modifications in form and details may be made therein without departing from the spirit and scope of this disclosure and are intended to form a part of the invention as defined by the following claims, which are to be interpreted in the broadest sense allowable by law.

What is claimed is:

1. An extruder for use in an additive manufacturing system, the extruder comprising:
    a first port to receive a first filament of a first build material having a first color;
    a second port to receive a second filament of a second build material having a second color;
    an extrusion port; and
    a cavity coupled in fluid communication with the first port, the second port, and the extrusion port, the cavity including one or more baffles to mix the first build material with the second build material while passing in a liquid state to the extrusion port, thereby producing a build material, wherein the baffles include one or more torsion inducing elements to alter flow of build material through the cavity and promote mixing.

2. The extruder of claim 1, further comprising a first motor operable to drive the first filament into the first port and a second motor operable to drive the second filament into the second port.

3. The extruder of claim 2, further comprising a control system that is operable to control a first feed rate of the first motor and a second feed rate of the second motor, based on the first color and the second color, to obtain a build material of a pre-determined color.

4. The extruder of claim 3, further comprising a color source in fluid communication with the extruder, wherein the control system is further operable to inject a color additive from the color source into the extruder.

5. The extruder of claim 4, in which the color source is configured to inject the color additive into the cavity of the extruder.

6. The extruder of claim 4, in which the color source is configured to inject the color additive prior to the cavity of the extruder.

7. The extruder of claim 3, further comprising a color sensor in data communication with the controller, the color sensor configured to sense a color of the build material, wherein the controller is further operable to control the first feed rate and the second feed rate based further on the color of the build material.

8. The extruder of claim 1, further comprising a third port to receive a third filament of a third build material having a third color.

9. The extruder of claim 1, in which a first in-feed axis along which the first filament is fed into the cavity is skewed with respect to a second in-feed axis along which the second filament is fed into the cavity.

10. The extruder of claim 9, in which the first and second in-feed axes are skewed with respect to an extrusion axis.

11. The extruder of claim 1, in which a volume of the cavity is less than or equal to two times a diameter of the first filament times a cross sectional area of the first filament.

12. An additive fabrication system comprising:
    an extruder configured to extrude a build material at a controlled volumetric rate in a liquid state;
    an x-y-z positioning system configured to controllably position the extruder within a build volume;
    a paint head having a controllable pose, the paint head configured to apply a controlled color of paint to a surface of the build material as the build material exits the extruder; and
    a processor coupled in a communicating relationship with the extruder and the x-y-z positioning system and configured to fabricate a three-dimensional model in the build volume from the build material of the extruder, the processor further configured to position and orient the nozzle of the paint head toward a predetermined location on an exterior surface of the object during fabrication of the exterior surface and to apply paint having a computer controlled color at the predetermined location.

13. A system for additive fabrication with color control, the system comprising:
    a filament of a build material;
    a supply of one or more color additives;
    an extruder having an port to receive the filament, an extrusion port, and a cavity coupling the port in fluid communication with the extrusion port;
    an injector fluidly coupled to the cavity, the injector configured to inject a controllable amount of the one or more color additives from the supply into the cavity;
    a color sensor configured to sense a color of a build material as the build material exits the extrusion port; and
    a control system that controls the injector to inject color additives based on a pre-determined desired color and the sensed color of the build material.

14. The system of claim 13, further comprising a motor operable to drive the filament into the port.

15. The system of claim 13, in which a volume of the cavity is less than or equal to two times a diameter of the filament times a cross sectional area of the filament.

16. The system of claim 13, further comprising one or more baffles in the cavity.

17. An additive fabrication system comprising:
    a build material provided as a filament;
    an extruder having an port to receive the filament, an extrusion port, and a cavity that couples the port in fluid communication with the extrusion port;
    a motor configured to provide a force to drive the filament into the port;
    a heater positioned to melt the filament within the cavity;
    a color source adapted to deliver a color additive to the filament;
    a sensor positioned to detect a color of a build material exiting the extrusion port; and
    a controller programmed to receive data from the sensor and to control operation of the motor, the heater, and the color source to achieve a predetermined color for the build material exiting the extrusion port.

18. The system of claim 17, in which the predetermined color is a user-defined color.

19. The system of claim 17, in which the predetermined color is identified from a 3D model.

20. The system of claim 17, in which the sensor includes a video camera.

21. The system of claim 17, in which the color source delivers the color additive into the cavity.

22. The system of claim 17, in which the color source delivers the color additive prior to the cavity.

23. The system of claim 17, further comprising one or more baffles within the cavity.

\* \* \* \* \*